United States Patent
Imai et al.

(10) Patent No.: US 7,340,147 B2
(45) Date of Patent: *Mar. 4, 2008

(54) OPTICAL WAVEGUIDE MATERIAL AND OPTICAL WAVEGUIDE

(75) Inventors: Tadayuki Imai, Kanagawa (JP); Kazuo Fujiura, Kanagawa (JP); Makoto Shimokozono, Kanagawa (JP); Seiji Toyoda, Kanagawa (JP); Masahiro Sasaura, Kanagawa (JP); Tohru Matsuura, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/420,192

(22) Filed: May 24, 2006

(65) Prior Publication Data

US 2006/0215981 A1    Sep. 28, 2006

Related U.S. Application Data

(60) Division of application No. 10/534,635, filed on May 11, 2005, now Pat. No. 7,177,514, which is a continuation of application No. PCT/JP2004/010197, filed on Jul. 16, 2004.

(30) Foreign Application Priority Data

Jul. 16, 2003  (JP) .............................. 2003-275520

(51) Int. Cl.
*G02B 6/10* (2006.01)
*C30B 29/30* (2006.01)

(52) U.S. Cl. ...................... 385/144; 385/129; 385/141; 385/142; 117/918; 117/948

(58) Field of Classification Search ..................... None
See application file for complete search history.

(56) References Cited

U.S. PATENT DOCUMENTS 5,581,396 A    12/1996 Kubota et al.

(Continued)

FOREIGN PATENT DOCUMENTS

EP    1 248 143 A2    10/2002

(Continued)

OTHER PUBLICATIONS

R.E. Fontana, Jr., et al., *Epitaxially Grown Single Crystal KTN for Thin Film Optical Modulators*, IEEE Journal of Quantum Electronics, vol.11, No. 9, Sep. 1975, pp. 860.

(Continued)

*Primary Examiner*—Rodney Bovernick
*Assistant Examiner*—Omar Rojas
(74) *Attorney, Agent, or Firm*—Workman Nydegger

(57) ABSTRACT

The invention provides an optical waveguide material whose refractive index can be tailored without changing the ratio of Ta and Nb. An optical waveguide of this invention comprising an under-clad layer 1 and a core 2 that is formed on the under-clad layer 1 and has a higher refractive index than that of the under-clad layer 1 is shown. For example, KTN ($KTa_{1-x}Nb_xO_3$) is used as the core 2, and a material that is obtained by substituting at least one element selected from the group consisting of Zr, Hf, and Sn for a portion of one element of the constituent elements of KTN and has the same perovskite type crystal structure as KTN is used as the clad. The refractive index of KTN can be reduced considerably, and this controllability widens the degree of freedom in the design of optical waveguide devices.

4 Claims, 4 Drawing Sheets

U.S. PATENT DOCUMENTS

| | | |
|---|---|---|
| 5,614,129 A | 3/1997 | Hofmeister et al. |
| 6,447,606 B2 | 9/2002 | Imaeda et al. |
| 6,792,189 B2 | 9/2004 | Sasaura et al. |
| 6,795,232 B2 | 9/2004 | Fujiura et al. |
| 6,873,751 B2 | 3/2005 | Nishizawa et al. |
| 6,996,321 B2 | 2/2006 | Sasaura et al. |
| 7,177,514 B2 * | 2/2007 | Imai et al. .................. 385/129 |
| 2003/0072550 A1 | 4/2003 | Sasaura et al. |

FOREIGN PATENT DOCUMENTS

| | | |
|---|---|---|
| EP | 1 260 839 A2 | 11/2002 |
| GB | 2 262 520 A | 6/1993 |
| JP | 8-190020 | 7/1996 |
| JP | 8-6083 | 12/1996 |
| JP | 11-335199 | 7/1999 |
| JP | 11-352862 | 12/1999 |
| JP | 2002-303903 | 10/2002 |
| JP | 2003-35831 | 2/2003 |

OTHER PUBLICATIONS

J. Hulliger et al., *Exploratory Technique in Liquid Phase Epitaxy of Potassium Tantalate Niobate*, Journal of Crystal Growth, vol. 99, No. 1-4, Jan. 1990, pp. 634-637.

* cited by examiner

OPTICAL WAVEGUIDE MATERIAL AND OPTICAL WAVEGUIDE

CROSS-REFERENCE TO RELATED APPLICATIONS

This application is a divisional application of U.S. patent application Ser. No. 10/534,635, filed May 11, 2005, which is a US Nationalization of International Application No. PCT/JP2004/010197, filed Jul. 16, 2004, which claims priority to Japanese Application No. 2003-275520, filed Jul. 16, 2003, which are incorporated herein by reference.

BACKGROUND OF THE INVENTION

1. The Field of the Invention

The present invention relates to an optical waveguide material and an optical waveguide, and more specifically, to an optical waveguide material used for optical waveguide devices for optical communications, its manufacture method, and an optical waveguide using this optical waveguide material.

2. The Relevant Technology

A structure in which a high refractive index material is surrounded by a material whose refractive index is lower than that of the high refractive index material acts as an optical waveguide that confines optical energy of light in the high refractive index region and its vicinity, and transmits the light in itself. A part whose refractive index is high is called a core, and a part whose refractive index is low is called a clad or cladding. The optical waveguide is applied to various optical components including those for optical communications.

Potassium tantalate niobate ($KTa_{1-x}Nb_xO_3$) is known as one example of the optical waveguide materials. $KTa_{1-x}Nb_xO_3$ (hereinafter referred to as KTN) is a material having the perovskite type crystal structure. FIG. 1 shows the unit cell of KTN crystal. When a simple cubic lattice having potassium ions on its lattice points is considered, an ion of tantalum or niobium is placed at its body center position, and oxygen ions are placed at its face center positions. KTN is a crystal material with a very large electro-optic effect that the refractive index varies upon application of an electric field (for example, see Patent Document 1). Moreover, since its refractive index will also vary when its composition is changed, an optical waveguide can be constructed with KTN by manufacturing a core and a clad each having a different composition.

The optical waveguide using KTN can modulate the phase of light being transmitted therein by means of the electro-optic effect by providing appropriate electrodes. Therefore, KTN can be used to manufacture optical components, such as an optical modulator etc., as is the case of $LiNbO_3$ whose development for optical components has been preceded. Since KTN has a remarkably large electro-optic effect as compared with $LiNbO_3$, KTN has the advantage of enabling optical components of higher performance in terms of low voltage operation etc. to be obtained.

In addition, $K_{1-y}Li_yTa_{1-x}Nb_xO_3$ (hereinafter referred to as KLTN) obtained by substituting Li for a portion of K of KTN is also a promising material that has the same perovskite type crystal structure as KTN and has a larger electro-optic effect than that of KTN.

However, with a change in a ratio of Ta and Nb in KTN and KLTN described above, the refractive index will vary, and at the same time the electro-optic coefficient and permittivity will change. For this reason, it was difficult to optimize characteristics of optical components by changing these parameters independently.

For example, when a refractive index difference between the core and the clad is set to 0.011 or more in order to enhance the performance of an optical waveguide element, the permittivities of the two members make a large difference. As a result, an electric field cannot be effectively applied to the optical waveguide, and hence an optical component making full use of a large electro-optic effect cannot be manufactured.

$KTaO_3$ (hereinafter referred to as KT) has a small electro-optic effect compared with KTN and KLTN described above, but is known as an optical waveguide material of a high refractive index and is transparent for light of wavelengths down to 350 nm. KT is a crystal of an end member of KTN and KLTN, having the same perovskite type crystal structure as KTN and KLTN. That is, if a portion of Ta of KT is substituted for by Nb, the partially substituted KT becomes KTN. If a portion of Ta of KT is substituted for by Nb and a portion of K is substituted for by Li, the partially substituted KT becomes KLTN. Therefore, KT is used as a substrate material on which KTN or KLTN crystal layers are grown. If an optical waveguide is constructed using KT, its refractive index cannot be controlled by changing a ratio of Ta and Nb, because KT does not include Nb.

The object of this invention is to provide an optical waveguide material whose refractive index can be tailored without changing the ratio of Ta and Nb.

Patent Document 1: Japanese Patent application laid-open No. 2003-35831.

BRIEF SUMMARY OF THE INVENTION

In order to achieve this object, this invention provides an optical waveguide material that is made up of a composition of $KTaO_3$ (KT) wherein at least one element selected from the group consisting of Zr, Hf, and Sn substituted for a portion of one element of the constituent elements of KT and that has the same perovskite type crystal stucture as KT.

The optical waveguide material may have a composition obtained by replacing a portion of one element of the constituent elements of KT with other element. Moreover, the optical waveguide material may be a crystal ($KTa_{1-x}Nb_xO_3$:KTN:0<=x<=1) having a composition obtained by substituting Nb for a portion of Ta of KT. Furthermore, the optical waveguide material may be a crystal ($K_{1-y}Li_yTa_{1-x}Nb_xO_3$:KLTN:0<=x<=1) having a composition obtained by substituting Li for a portion of K of KTN.

BRIEF DESCRIPTION OF THE DRAWINGS

Various embodiments of the present invention will now be discussed with reference to the appended drawings. It is appreciated that these drawings depict only typical embodiments of the invention and are therefore not to be considered limiting of its scope.

DETAILED DESCRIPTION OF THE PREFERRED EMBODIMENTS

Figure 1:
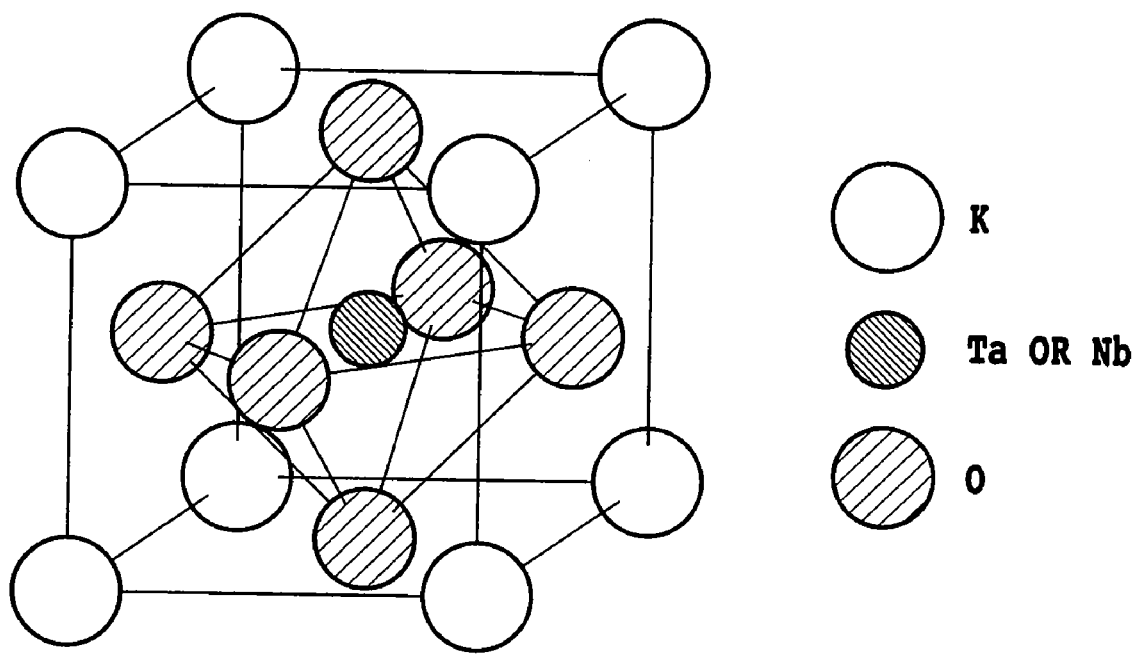
FIG. 1 is a view showing a unit cell of KTN crystal.

Examples of this invention will be described below referring to the drawings.

Figure 2:
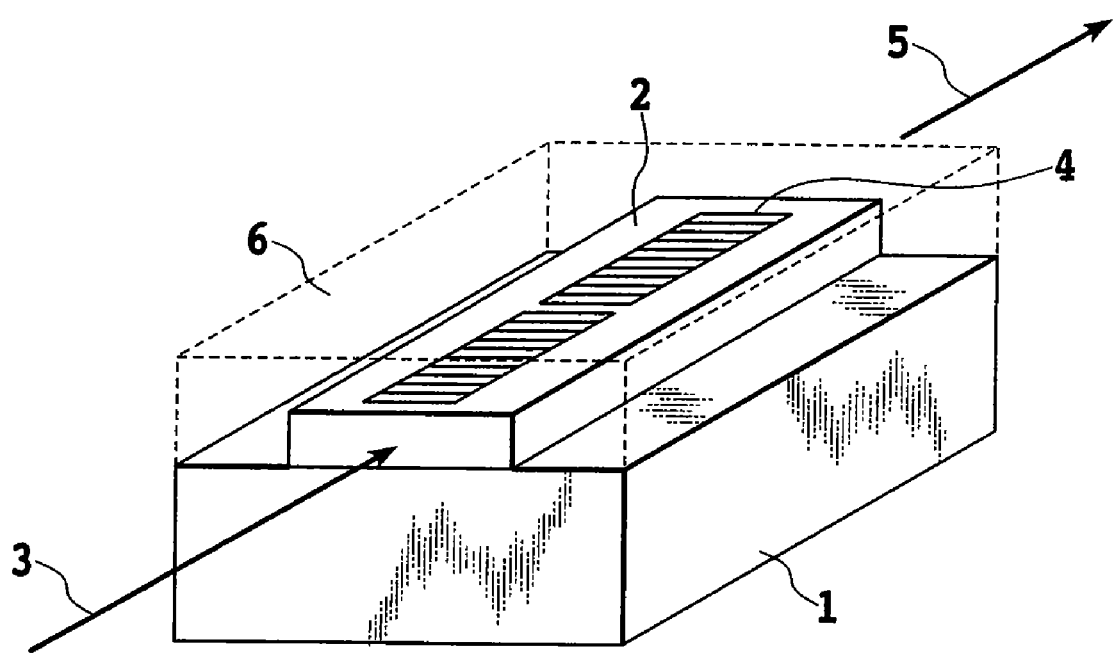
FIG. 2 is a perspective view showing a structure of the optical waveguide to which the optical waveguide material of this vention is applied.

FIG. 2 is a perspective view showing a structure of the optical waveguide to which the optical waveguide material of this invention is applied. The basic structure of the optical waveguide is a ridge type optical waveguide, and has electrodes for applying an electric field as one example of an external field applying mechanism. A substrate acts as an under-clad layer 1, on which a core 2 having a higher refractive index than that of the substrate is formed. An electrode 4 for applying an electric field is formed on the upper side of the core 2. Incidentally, an over-clad layer (cover layer) 6 that covers the core 2 and has a lower refractive index than that of the core 2 may be formed to make an embedded optical waveguide. All of the under-clad layer 1, the core 2, and the over-clad layer 6 are made of any one of materials of KT, KTN, and KLTN.

Here, even when the core and the clad are made up of a crystal of the same composition, the refractive index difference between the core and the clad can be controlled by the amount of at least one element selected from the group consisting of Zr, Hf, and Sn that has substituted for a portion of one element of the constituent elements of its original crystal. This is because the refractive index of any one of KT, KTN, and KLTN can be lowered by substituting at least one element selected from the group consisting of Zr, Hf, and Sn for a portion of one element of the constituent elements of that crystal. The amount of decrease in the refractive index is proportional to the amount of the elements Zr, Hf, and Sn that was used for substitution. Therefore, in the optical waveguide of this example, the refractive index difference between the core and the clad can be controlled without changing the ratio of Ta and Nb.

By this structure, the optical input signal 3 is launched from an optical-waveguide end face, and transmitted in the core 2. The core 2 produces a refractive index change by an external voltage signal applied to the core 2 with the electrode 4. By this arrangement, a propagating optical signal is phase-modulated when passing through the core 2. The optical signal that was modulated is taken out from a counter end face to the outside as an optical output signal 5. It is obvious that the structure of the optical waveguide described above is just to show one example, and the optical waveguide material of the invention is not applied only to this structure of the optical waveguide.

In the one example of this invention, at least one of the under-clad layer 1, the core 2, and the over-clad layer 6 uses a material that is a crystal of one composition selected from among compositions of KT, KTN, and KLTN wherein at least one element selected from the group consisting of Zr, Hf, and Sn is substituted for a portion of one element of the constituent elements of the selected composition and has the same perovskite crystal structure as KT. Hereafter, the optical waveguide material of this invention will be described more concretely.

It is well known that a refractive index of an arbitrary, transparent medium can be controlled by adding a very small amount of an additive to the medium. While it is relatively easy to add an additive to polymer materials, glasses, ceramics, etc. it is usually not easy to add an additive to single crystals. This is because when a signal crystal is grown, impurities that inhibit the formation of a stable crystal structure are eliminated.

The single crystals of KT, KTN, and KLTN can be grown by adding potassium oxide ($K_2O$) as a flux to raw materials, melting them, and cooling down the melt slowly. In order to add other element(s) to one of these crystals, as a general case, the intended element is melted together with raw materials of the crystal, and the crystal is grown from the melt of them.

A ratio k=x/X of a mole concentration x of an additive in the crystal to a mole concentration X of the additive in the melt is termed the segregation coefficient. As mentioned above, most impurities are hard to be incorporated in crystals, and accordingly k's are very small. For example, when adding copper (Cu), k is roughly in the range from $10^{-3}$ to $10^{-2}$ depending on conditions. This fact becomes a main reason why it is difficult to change the refractive index by 0.0001 or more (equivalent to a relative refractive index change of 0.05% or more). Generally, it is not easy to predict which additive has a better tendency to be incorporated into a certain transparent medium, and whether that additive has an effect to modify the refractive index.

The inventors of this invention have found that zirconium (Zr), hafnium (Hf), and tin (Sn) are easy to be incorporated into single crystals of KT, KTN, and KLTN system materials as compared with other additives, and that the segregation coefficients k's for these cases exceed 1.0. For this reason, when one or more of these elements are added, the addition can cause a large refractive index decrease as much as 0.01.

Refractive indices of KT (including KTN and KLTN) system waveguide materials are approximately 2.2, and so this refractive index change is 0.5% when expressed at a ratio to the refractive index. This is comparable to a refractive index difference between a core and a clad of the common optical waveguide. That is, putting this invention into practice enables the refractive index of an optical waveguide to be controlled sufficiently, and accordingly it becomes possible to manufacture a device that is optimized in terms of both electric properties, such as permittivity, and the refractive index difference. As a result, the degree of freedom in the design of optical waveguide devices using these single crystals can be widened, and hence their performance in terms of the operating voltage, the band, etc. can be improved.

EXAMPLE 1

Powders of potassium carbonate ($K_2CO_3$) and tantalum oxide ($Ta_2O_5$) are mixed in a mole ratio of 3:2, charged in a platinum crucible, heated to 1400° C. in an electric furnace, and made to react with each other sufficiently. Then, the melt is cooled slowly to 800° C. in ten days to grow a crystal of $KTaO_3$. The refractive index of the taken-out single crystal is 2.1542 at 1550 nm wavelength.

Similarly, $ZrO_2$ of a mole ratio of 1% is mixed with the mixed powders of tantalum oxide and potassium carbonate, and a crystal of $KTaO_3$ is grown. The refractive index of the $KTaO_3$ single crystal to which Zr was added is 2.1407 at 1550 nm wavelength. Thereby, a refractive index difference of 0.0135 can be created.

Figure 3:
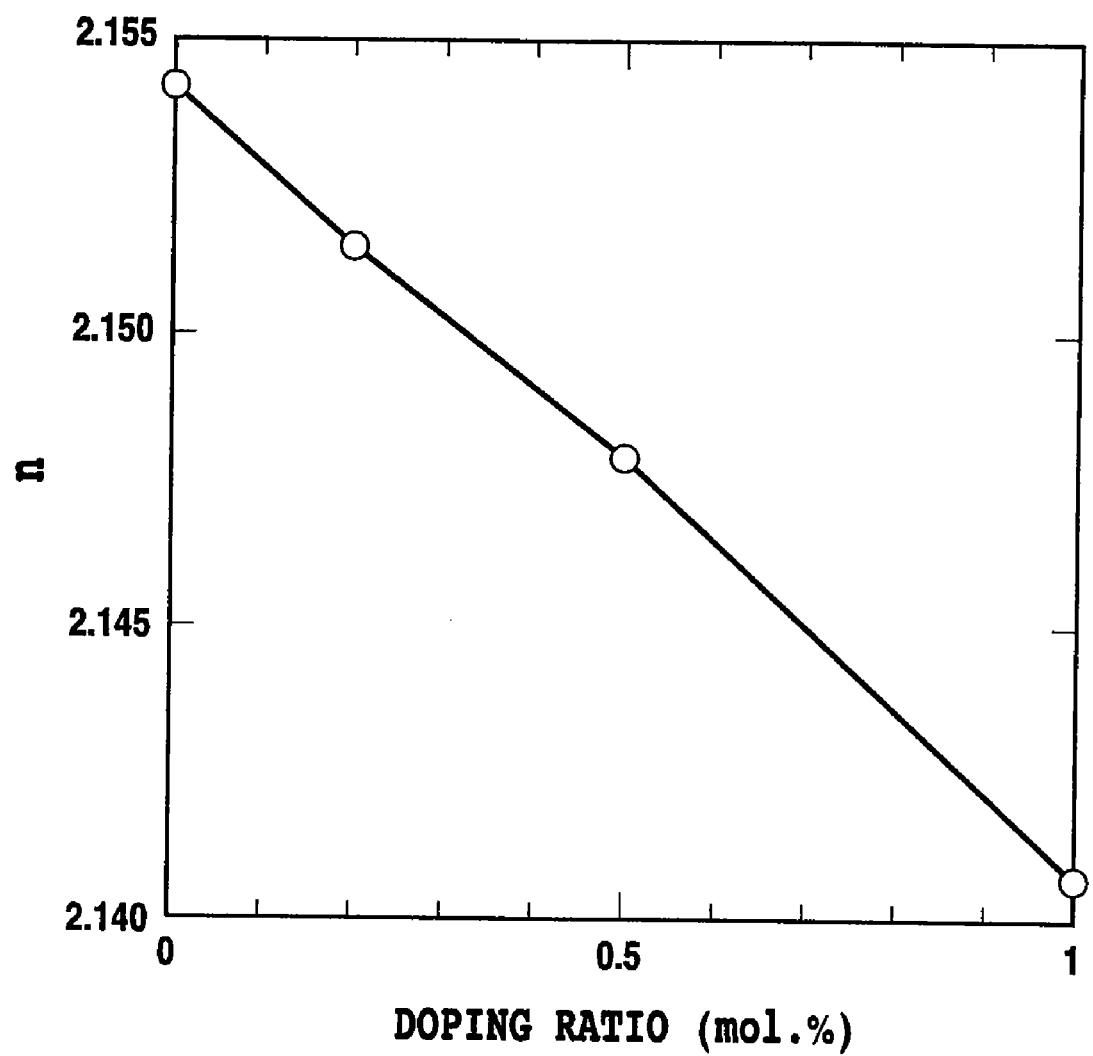
FIG. 3 is a diagram showing the relationship between the amount of addition of Zr and the refractive index.

FIG. 3 shows the relationship between the amount of addition of Zr and the refractive index. This graph has a horizontal axis representing the amount of $ZrO_2$ mixed into raw materials of $K_2CO^3$ and $Ta_2O_5$ and a vertical axis representing the refractive index of the obtained single crystal. The graph shows that with increasing amount of addition of $ZrO_2$, the refractive index decreases. Incidentally, the segregation coefficient of Zr is 2.6.

Next, the single crystal grown from the raw materials to which 1 mol % $ZrO_2$ was added is sliced to produce a substrate. On this substrate, an optical-waveguide core part made up of a $KTaO_3$ single crystal with nothing added is formed, and then a $KTaO_3$ single crystal film to which 1 mol % $ZrO_2$ was added is grown as a clad in such a way as to cover the core part. The manufactured optical waveguide can transmit light, the light being confined in the core part and its vicinity as designed.

EXAMPLE 2

A part of tantalum oxide in the raw materials in the example 1 is replaced with niobium oxide ($Nb_2O_5$), and a crystal of KTN is grown. As a result, with addition of 1 mole % $ZrO_2$, the refractive index is deceased by about 0.01, regardless of a value of composition ratio x of $KTa_{1-x}Nb_xO_3$.

EXAMPLE 3

Further, a crystal of KLTN is grown by replacing a part of potassium carbonate in the raw materials in the example 2 with lithium carbonate. By adding 1 mol % $ZrO_2$, the refractive index can be lowered by about 0.01. Alternatively, also in the case where crystal growth is performed by replacement of potassium carbonate with sodium carbonate instead of lithium carbonate, the refractive index difference can be created as a decrease of 0.01 by adding $ZrO_2$ similarly.

EXAMPLE 4

$HfO_2$ is added instead of $ZrO_2$ for each of KT, KTN, and KLTN. The addition of 1 mol % $HfO_2$ can decrease the refractive index by 0.015. Similarly, when adding $SnO_2$, the refractive index can be decreased by 0.006 for the same amount of addition.

Figure 4:
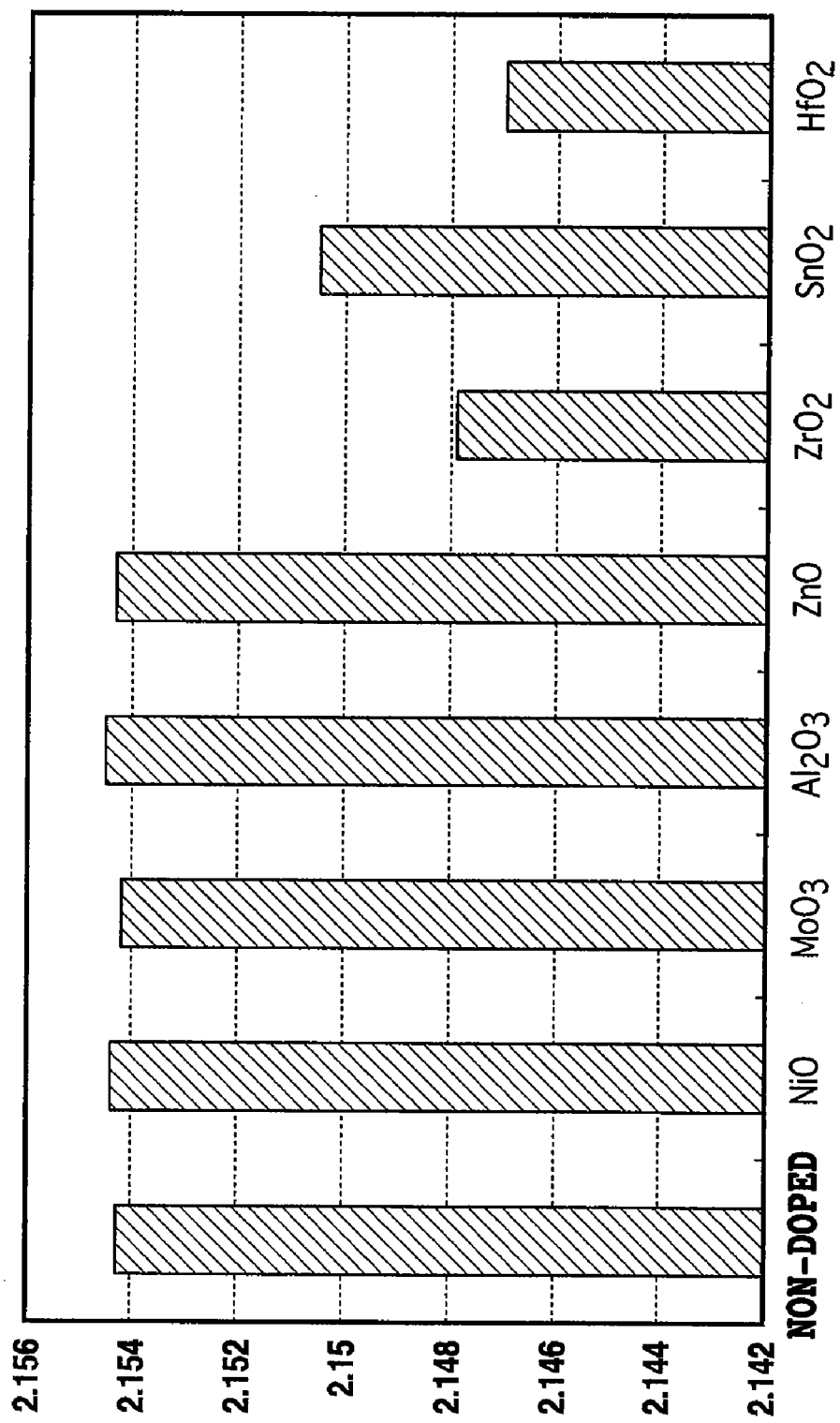
FIG. 4 is a diagram showing the refractive index of KTN crystal obtained with the amount of addition of 0.5 mol %.

FIG. 4 shows the refractive index of KTN crystal obtained with an amount of addition of 0.5 mol%. As is clear from FIG. 4, the additives of $ZrO_2$, $SnO_2$, and $HfO_2$ effectively decrease the refractive index, respectively, whereas other additives (NiO, $MoO_3$, $Al_2O_3$, and ZnO) than that of the three additives can hardly change the refractive index of KTN.

INDUSTRIAL APPLICABILITY

This invention relates to the optical waveguide material used for optical components for optical communications and the like and can provide the optical waveguide material whose refractive index can be tailored without changing the ratio of Ta and Nb. Moreover, this invention can widen the degree of freedom in the design of optical waveguide devices using these single crystals and improve their performance in terms of the operating voltage, the band, etc.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical waveguide comprising a core and a clad whose refractive index is lower than that of the core, said optical waveguide comprising:
   a core material and a clad material comprising a crystal that has a composition of $KTaO_3$ (KT),
   at least one element selected from the group consisting of Zr, Hf, and Sn substituting for a portion of one element of the constituent elements of KT,
   said crystal having the same perovskite type crystal structure as KT, and
   the refractive index difference between the core and the clad being controlled by the amount of the at least one element selected from the group consisting of Zr, Hf, and Sn so that the amount of the clad is higher than the amount of the core.

2. The optical waveguide according to claim 1, wherein the crystal has a composition obtained by replacing a portion of one element of the constituent elements of KT with other element.

3. The optical waveguide according to claim 1, wherein at least either the core material or the clad material is made up of a crystal ($KTa_{1-x}Nb_xO_3$:KTN:0<=x<=1) having a composition obtained by substituting Nb for a portion of Ta of KT.

4. The optical waveguide according to claim 1, wherein at least either the core material or the clad material is made up of a crystal ($K_{1-y}Li_yTa_{1-x}Nb_xO_3$:KLTN:0<=x, y<=1) having a composition obtained by substituting Li for a portion of K of KTN.

* * * * *